(12) United States Patent
Maruyama

(10) Patent No.: US 6,498,743 B2
(45) Date of Patent: Dec. 24, 2002

(54) METHOD FOR SUPPLYING REFERENCE POTENTIAL TO SENSE AMPLIFIER CIRCUIT IN SEMICONDUCTOR INTEGRATED CIRCUIT, SEMICONDUCTOR INTEGRATED CIRCUIT, SEMICONDUCTOR DEVICE EQUIPPED WITH MANY OF THE SEMICONDUCTOR INTEGRATED CIRCUITS, AND ELECTRONIC APPARATUS USING THE SEMICONDUCTOR DEVICE

(75) Inventor: Akira Maruyama, Nagano-ken (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/895,000

(22) Filed: Jun. 28, 2001

(65) Prior Publication Data

US 2002/0015324 A1 Feb. 7, 2002

(30) Foreign Application Priority Data

Jun. 29, 2000 (JP) ........................................ 2000-196485
Jun. 20, 2001 (JP) ........................................ 2001-186697

(51) Int. Cl.$^7$ ............................................... G11C 11/22
(52) U.S. Cl. .................................. 365/145; 365/189.09
(58) Field of Search ................................ 365/145, 117, 365/121, 189.09, 207, 65

(56) References Cited

U.S. PATENT DOCUMENTS 5,805,495 A * 9/1998 Kimura ....................... 365/117
5,905,672 A * 5/1999 Seyyedy ...................... 365/145
5,999,439 A * 12/1999 Seyyedy ...................... 365/145
6,198,653 B1 * 3/2001 Tanaka ........................ 365/145

* cited by examiner

Primary Examiner—David Nelms
Assistant Examiner—Thong Le
(74) Attorney, Agent, or Firm—Harness, Dickey & Pierce, P.L.C

(57) ABSTRACT

A semiconductor integrated circuit is equipped with a memory cell including a capacitor composing a ferroelectric body that stores data depending on a polarization state determined by an applied voltage and a direction of the voltage, a sense amplifier circuit that reads out data from the memory cell, and a reference potential generation circuit that generates a reference potential VREF for the sense amplifier circuit. When supplying the reference potential VREF to the sense amplifier circuit, when data is read from the ferroelectric body, the reference potential VREF from the reference potential generation circuit is supplied to the sense amplifier circuit based on a signal PLR for driving a cell plate that forms one of electrodes of the capacitor.

11 Claims, 4 Drawing Sheets

METHOD FOR SUPPLYING REFERENCE POTENTIAL TO SENSE AMPLIFIER CIRCUIT IN SEMICONDUCTOR INTEGRATED CIRCUIT, SEMICONDUCTOR INTEGRATED CIRCUIT, SEMICONDUCTOR DEVICE EQUIPPED WITH MANY OF THE SEMICONDUCTOR INTEGRATED CIRCUITS, AND ELECTRONIC APPARATUS USING THE SEMICONDUCTOR DEVICE

BACKGROUND OF THE INVENTION

1. Technical Field of the Invention

The present invention relates to a method for supplying a reference potential to a sense amplifier circuit in a semiconductor integrated circuit that is equipped with a memory cell including a capacitor as a charge storage capacitor and a switch element as a transfer gate, a semiconductor integrated circuit, a semiconductor device equipped with many of the semiconductor integrated circuits, and an electronic apparatus using the semiconductor device, and more particularly to a technology to control the timing for supplying a reference potential to a sense amplifier circuit at the time of data reading.

2. Conventional Technology

A conventional semiconductor integrated circuit structure equipped with capacitors having ferroelectric bodies and their operation are shown in a block diagram in FIG. 6 and in a timing chart shown in FIG. 7, respectively.

First, the circuit structure shown in FIG. 6 is described. As being well known, memory cells 1~4 arranged side by side include, as their components, capacitors 9, 10, 11 and 12 as charge storage capacitors formed from ferroelectric bodies, and Nch transistors 5, 6, 7 and 8 as transfer gates for switching the capacitors, respectively. With a sense amplifier 13 for reading data being at the center, each of the memory cells 1 and 2 is connected to the sense amplifier 13 through a bit line BLR on the right side of the sense amplifier 13, and is also connected to a plate line PLR on the right side. On the other hand, each of the memory cells 3 and 4 is connected to the sense amplifier 13 through a bit line BLL on the left side, and is also connected to a plate line PLL on the left side. Gates of the Nch transistors 5, 6, 7 and 8 of the memory cells are connected to corresponding independent word lines WL1R, WL2R, WL1L and WL2L, respectively. Each of the bit lines BLR and BLL is connected to one of the source/drain of each of the Nch transistors 15 and 16, respectively. The other of the source/drain of each of the Nch transistors 15 and 16 is grounded, and gates thereof are connected to signal lines for providing pre-charge signals PRC.

The sense amplifier 13 receives an input of a sense amplifier drive signal SA and outputs data read out from each of the memory cells. A reference potential VREF is inputted in the sense amplifier 13 from a reference potential generation circuit 14 through the Nch transistors 17 and 18. Gates of the Nch transistors 17 and 18 connect to signal lines that transfer reference potential application signals REFL and REFR, respectively.

Also, a block selection circuit 19 outputs a block signal BLK to selectively switch between a group of the signal lines on the right side to be driven (WL1R, WL2R, PLR, REFR) and a group of the signal lines on the left side (WL1L, WL2L, PLL, REFL), and to select among the memory cells 1~4 that are subject to a reading operation or a writing operation.

Next, a reading operation is described with reference to FIG. 6 and FIG. 7. FIG. 5 is a timing chart of a reading operation. For example, when the memory cell 1 is read, the pre-charge signal PRC is lowered from the power supply potential VDD to the GND potential, and then the block signal BLK is elevated to the power supply potential VDD. Subsequently, the reference potential application signal REFR is elevated, then, the bit line BLL is charged to the reference potential VREF because the Nch transistor 18 is turned on, such that the bit line BLR retains the GND potential (in an open state). Next, the GND potential on the word line WL1R is set to the power supply potential VDD, to thereby put the transistor 5 in an ON state. Subsequently, when the GND potential on the cell plate line PLR is set to the power supply potential VDD, a potential corresponding to a charge (data) associated with a polarization retained in the ferroelectric capacitor 9 is generated on the bit line BLR. Here, when the reference potential VREF is set at a value intermediate the bit line potentials that are to be generated respectively corresponding to H level and L level of data, the sense amplifier 13 detects and amplifies the magnitude of the potential, such that data corresponding to H level or L level of memory cell data are outputted. It is noted that, in here, WL1L, WL2L, PLL and REFL are fixed at the GND potential by the BLK signal.

In the conventional semiconductor integrated circuit, as shown in FIG. 7, the timing to turn on the sense amplifier 13 (the timing at which the sense amplifier drive signal SA is elevated to the power supply potential VDD) must be set, in theory, at least after t3. In addition, in practice, a response delay in the detection sensitivity of the sense amplifier, a delay time in which ΔV (a potential difference on the bit line BLR, BLL with respect to the reference potential VREF) becomes sufficiently large, and the like have to be considered. Therefore, the timing to turn on the sense amplifier 13 has to be set in a period after t4. For this reason, a fatal problem as a memory device, namely, slow reading speed, has not been overcome.

The present invention solves the problem described above, and its object is to quicken the timing to apply a reference potential to be supplied to a sense amplifier, to thereby quicken the on-timing of the sense amplifier, and to improve the reading speed.

SUMMARY OF THE INVENTION

In a method for supplying a reference potential to a sense amplifier in a semiconductor integrated circuit in accordance with the present invention, a method is provided for supplying a reference potential to a sense amplifier in a semiconductor integrated circuit equipped with a memory cell including a capacitor composing a ferroelectric body that stores data depending on a polarization state determined by an applied voltage and a direction of the voltage, a sense amplifier circuit that reads out data from the memory cell, and a reference potential generation circuit that generates a reference potential for the sense amplifier circuit, wherein, when the data is read from the ferroelectric body, a reference potential from the reference potential generation circuit is supplied to the sense amplifier circuit based on a signal that drives a cell plate that composes one of the electrodes of the capacitor.

Also, in a semiconductor integrated circuit in accordance with the present invention, the semiconductor integrated circuit reads the data from the ferroelectric body by the method for supplying a reference potential described above, and is equipped with a memory cell including a capacitor composing a ferroelectric body that stores data depending on a polarization state determined by an applied voltage and a direction of the voltage, a sense amplifier circuit that reads out data from the memory cell, and a reference potential generation circuit that generates a reference potential for the sense amplifier circuit.

Furthermore, in a semiconductor integrated circuit in accordance with the present invention, the semiconductor integrated circuit is equipped with a memory cell including a capacitor composing a ferroelectric body that stores data depending on a polarization state determined by an applied voltage and a direction of the voltage, a sense amplifier circuit that reads out data from the memory cell, and a reference potential generation circuit that generates a reference potential for the sense amplifier circuit, wherein a plate line is connected to a cell plate that composes one of the electrodes of the capacitor for transmitting a drive signal for reading out the data, and wherein a switch element is interposed in a supply path for supplying the reference potential between the reference potential generation circuit and the sense amplifier circuit, wherein the switch element is connected to the plate line, and is placed in an ON state upon receiving the drive signal that is transmitted to the plate line, and the reference potential is supplied to the sense amplifier circuit through the switch element.

Also, in a semiconductor device in accordance with the present invention, the semiconductor device is equipped with a memory cell group including many of the memory cells arranged side by side, the bit line and the plate line, the word lines, and the sense amplifier circuit in the semiconductor integrated circuit described above, wherein a data output line is connected to the sense amplifier circuit for reading out the data.

Furthermore, an electronic apparatus in accordance with the present invention is equipped with the semiconductor device described above.

In accordance with the present invention described above, a reference potential to be applied to the sense amplifier is applied at the same timing as a potential shift on the bit line, such that the timing of the sense amplifier is quickened, and therefore the reading speed can be improved.

BRIEF DESCRIPTION OF THE DRAWINGS

FIG. 1 shows a circuit diagram of a semiconductor integrated circuit in accordance with one embodiment of the present invention, wherein FIG. 1(a) is an overall circuit diagram thereof, and FIG. 1(b) is a logical gate diagram of an example structure of a block selection circuit shown in FIG. 1(a).

DETAILED DESCRIPTION OF THE PREFERRED EMBODIMENTS

Structures and operations of the conventional technology described above overlap those of an embodiment of the present invention. Therefore, features different from the conventional technology are mainly described.

Figure 1:
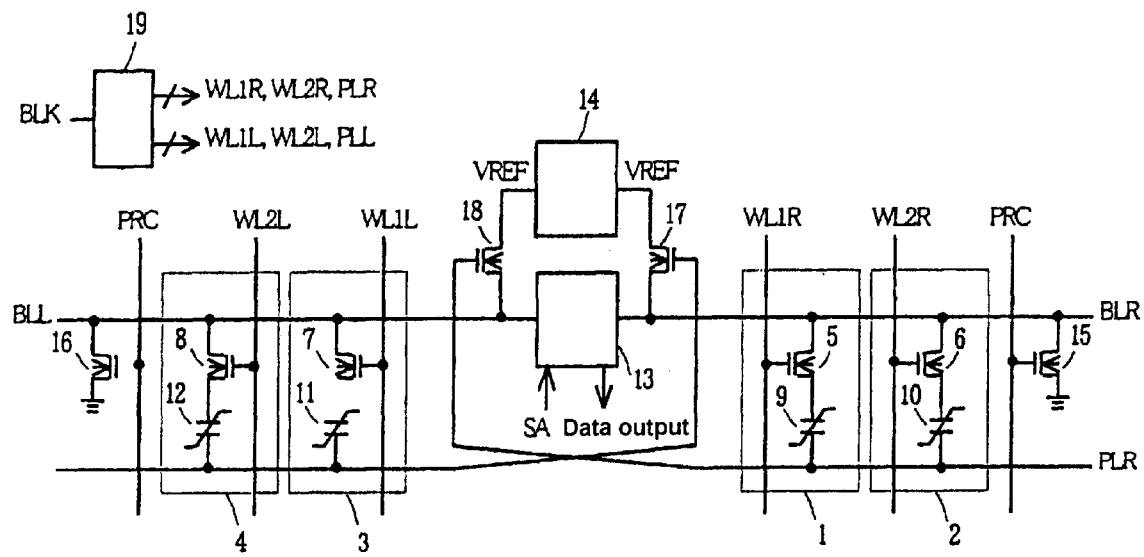
Figure 1:
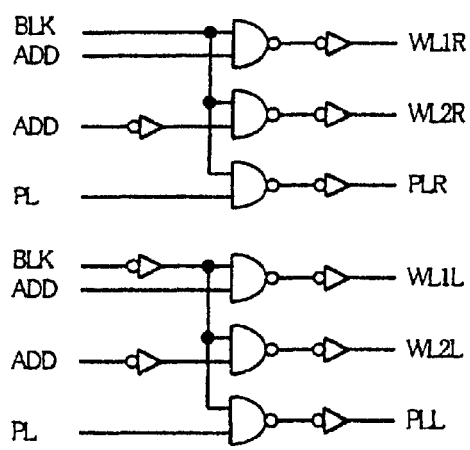
Figure 6:
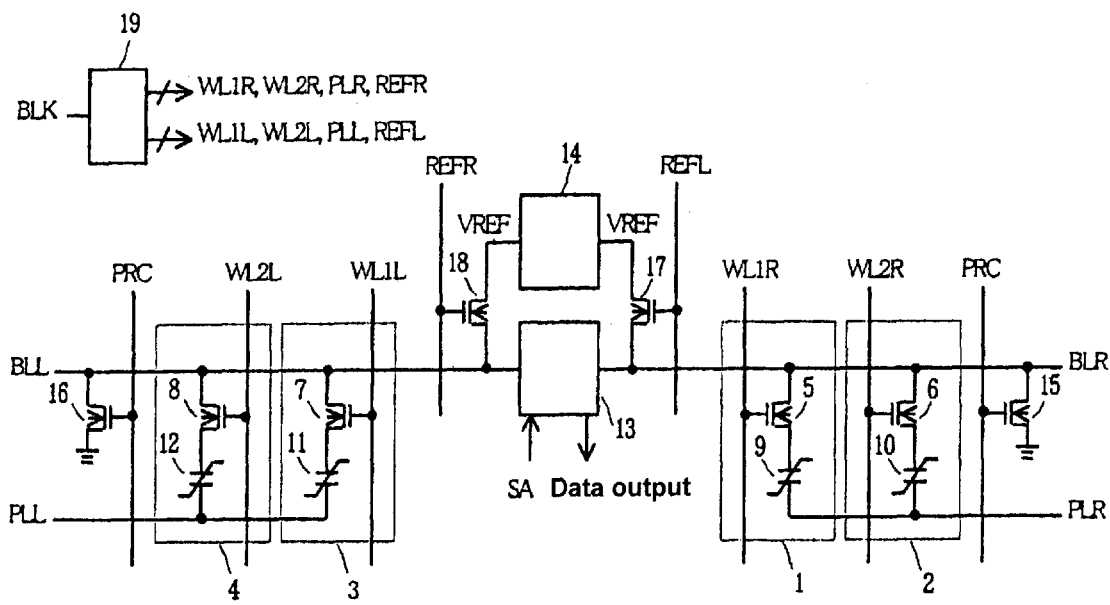
FIG. 6 shows a circuit diagram of a conventional semiconductor integrated circuit.
Figure 7:
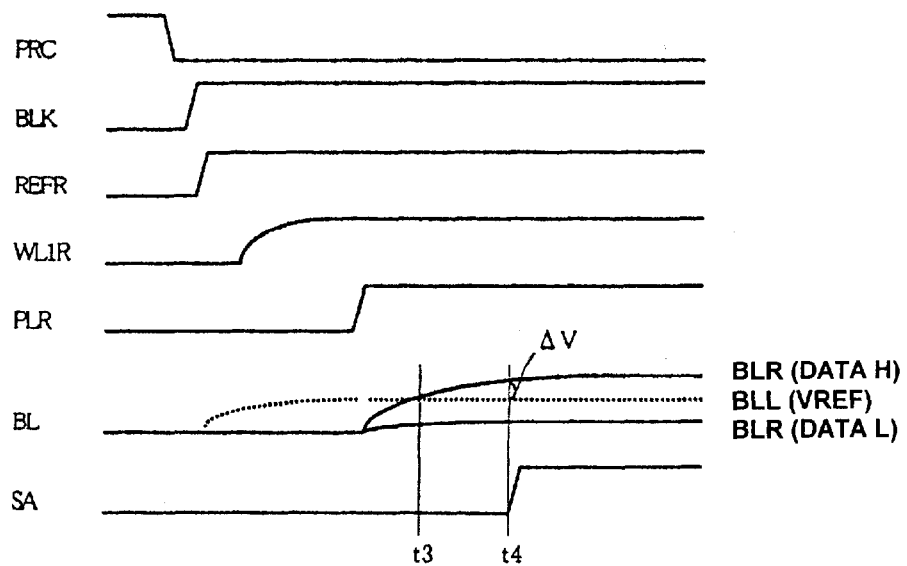
FIG. 7 shows a timing chart of the conventional example.

First, a general idea is described. In a semiconductor integrated circuit in accordance with the present invention, first, the conventional circuit described above with reference to FIG. 6 is modified in a manner that the plate line PLR on the right side is connected to the gate of the Nch transistor 18, and the plate line PLL on the left side is connected to the gate of the Nch transistor 17, whereby a circuit structure in accordance with one embodiment of the present invention shown in FIG. 1(a) is provided. In other words, signals that drive cell plates are used as signals to turn on and off the Nch transistors 17 and 18 that supply the reference potential VREF to the sense amplifier 13, instead of the conventional reference potential application signals REFR and REFL shown in FIG. 6. As a result, the signal lines for transferring the reference potential application signals REFR and REFL shown in FIG. 4, which are conventionally required for supplying the reference potential VREF to be used for data reading to the sense amplifier 13, can be eliminated as shown in the embodiment example in FIG. 1(a). To specify a memory cell to be read in response to the inputted block signal BLK, the word lines WL1R, WL2R, WL1L and WL2L, and the block selection circuit 19 for selectively driving the plate lines PLR and PLL are formed from, for example, a logical gate circuit shown in FIG. 1(b), as may be well known.

With such a circuit structure, an example operation of reading data from the memory cells 1 and 2 on the right side of the sense amplifier 13 shown in FIG. 1(a) is described. As shown in a timing chart in FIG. 2, in conducting a reading operation, when the potential of the signal to drive the cell plate, which is transferred through the plate line PLR, rises, the risen potential is applied to the gate of the Nch transistor 18 to turn it ON. As the Nch transistor 18 is turned ON, the reference potential VREF from the reference potential generation circuit 18 is supplied through the bit line BLL to the sense amplifier circuit 13. In other words, the reference potential VREF is applied at the same timing as the change in the potential on the bit line BLR occurs.

Figure 2:
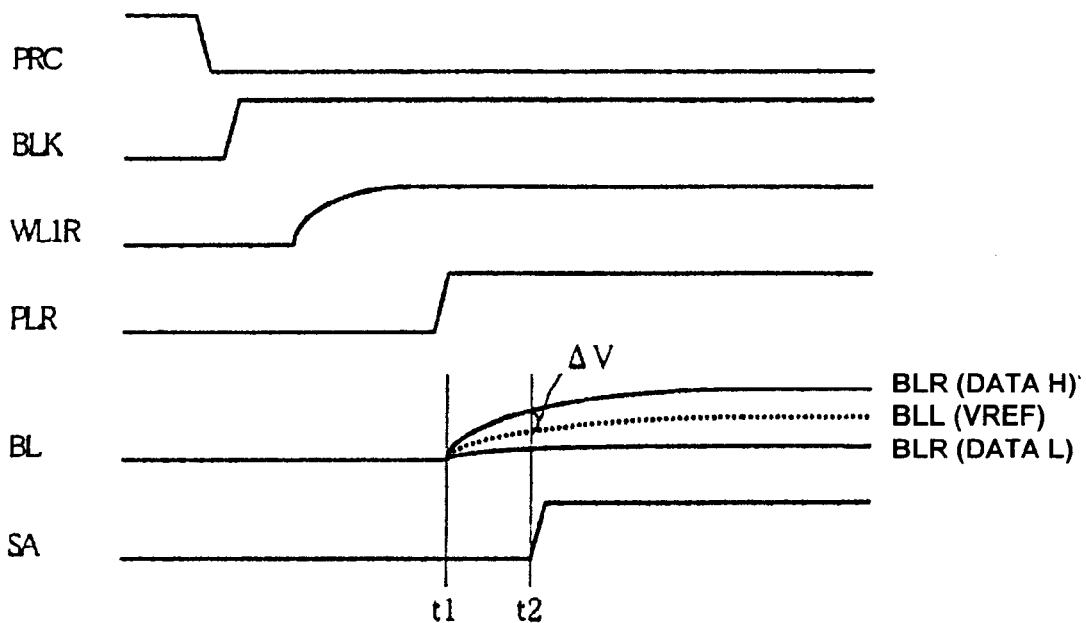
FIG. 2 shows a timing chart in accordance with one embodiment of the present invention.

The reading operation is described below in greater detail. As shown in FIG. 1(a) and FIG. 2, when the memory cell 1 is read, the pre-charge signal PRC is dropped from the power supply potential VDD to the GND potential, and then the block signal BLK is elevated to the power supply potential VDD. At this moment, the bit line BLR is retained at the GND potential (in an open state). Next, the GND potential on the word line WL1R is set to the power supply potential VDD to thereby put the transistor 5 in an ON state. Then, when the GND potential on the cell plate line PLR is set to the power supply potential VDD, a potential corresponding to a charge (data) associated with a polarization retained in the ferroelectric capacitor 9 is generated on the bit line BLR. At this time, since the Nch transistor 18 simultaneously turns on, the bit line BLL is charged to the reference potential VREF.

Here, when the reference potential VREF is set at a value intermediate the bit line potentials that are to be generated respectively corresponding to H level and L level of data, the sense amplifier 13 detects and amplifies the magnitude of the potential, such that data corresponding to H level or L level of memory cell data are outputted. It is noted that, in here, WL1L, WL2L and PLL are fixed at the GND potential by the BLK signal.

In the present embodiment, as shown in FIG. 2, the reference potential VREF is applied to the sense amplifier at the rise timing on the plate line PLR. Therefore, a potential change in the reference potential VREF is applied at the same timing as a potential change on the bit line BLR. Therefore, the timing to turn on the sense amplifier 13 (the timing at which the sense amplifier drive signal SA rises to the power supply potential VDD) can be set at least later than t1 in FIG. 2, and, in practice, in a period later than t2 (<t4) in view of the detection sensitivity of the sense amplifier and ΔV. As a result, the reading speed can be improved compared to the conventional example.

Also, the current supply capability of the Nch transistors 17 and 18 may preferably be the same as the current supply capability of the Nch transistor 5 in the memory cell 1. As a result, a potential shift waveform (rise time) of the reference potential VREF can be made to be identical with a potential shift waveform (rise time) of the bit line BLR. Therefore, a highly accurate data determination (to determine H or L) can be quickly performed, and the data reading operation can be further quickened.

It is noted that data reading operations for the memory cell 2 and the memory cells 3 and 4 on the left side of the sense amplifier 13 are conducted in the same manner as described above with respect to the memory cell 1.

Figure 3:
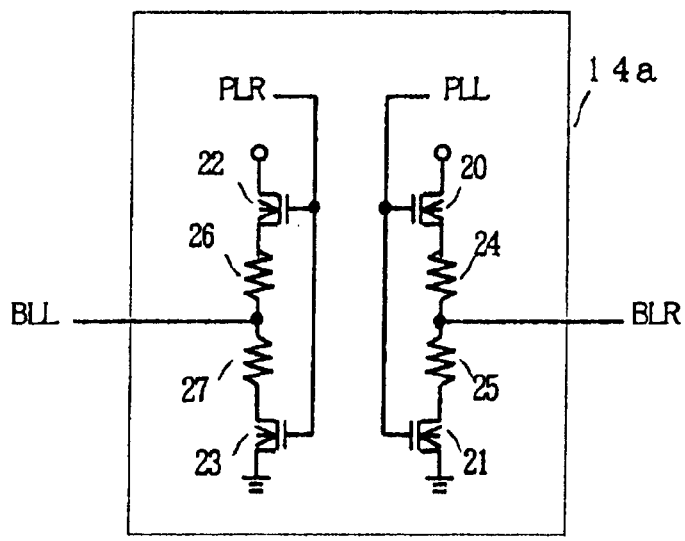
FIG. 3 shows a circuit diagram of a reference potential generation circuit in accordance with a modified embodiment of the present invention.

A circuit diagram of a modification example of the present embodiment is shown in FIG. 3. In the modification example, a portion including the reference potential generation circuit 14 and the Nch transistors 17 and 18 in the embodiment shown in FIG. 1(a) is replaced with a reference potential generation circuit 14a shown in FIG. 3. The reference potential generation circuit 14a in the modification example is formed from Nch transistors 20–23 and resistances 24–27. For reading the memory cell 1, when the plate line PLR is set to the power supply potential VDD, the Nch transistors 22 and 23 are turned on, and therefore a reference potential VREF that is determined by the division between the resistances 26 and 27 is supplied to the bit line BLL. Accordingly, a potential change in the reference potential VREF can be applied at the same timing as a potential change on the bit line BLR. Furthermore, the current supply capability of the Nch transistors 22 and 23 (20 and 21) may be set to be the same as the current supply capability of the transistor 5 in the memory cell 1. As a result, a potential shift waveform (rise time) of the reference potential VREF can be made to be identical with a potential shift waveform (rise time) of the bit line BLR. Therefore, a highly accurate data determination (to determine H or L) can be quickly performed, and the data reading operation can be further quickened.

Here, many of the semiconductor integrated circuits containing memory cells in accordance with the present invention may be placed side by side with a data writing circuit being added and a decoder for the word lines and the bit lines is used in a well known manner to thereby form a semiconductor device such as an FeRAM (Ferroelectric Random-access Memory).

Figure 5:
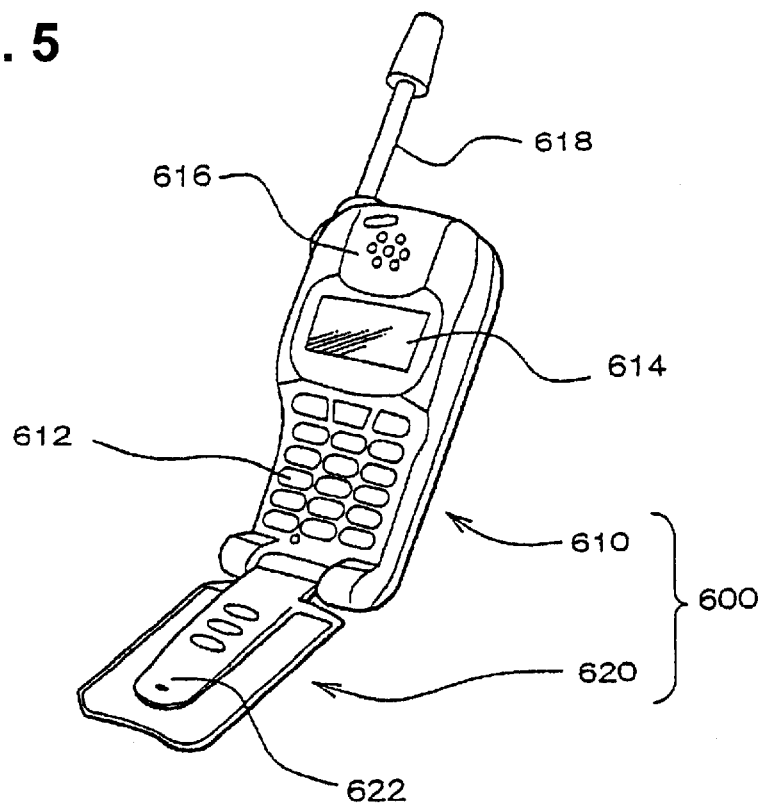
FIG. 5 shows a perspective view of a hand-carry type telephone that is equipped with the system shown in FIG. 4.
Figure 4:
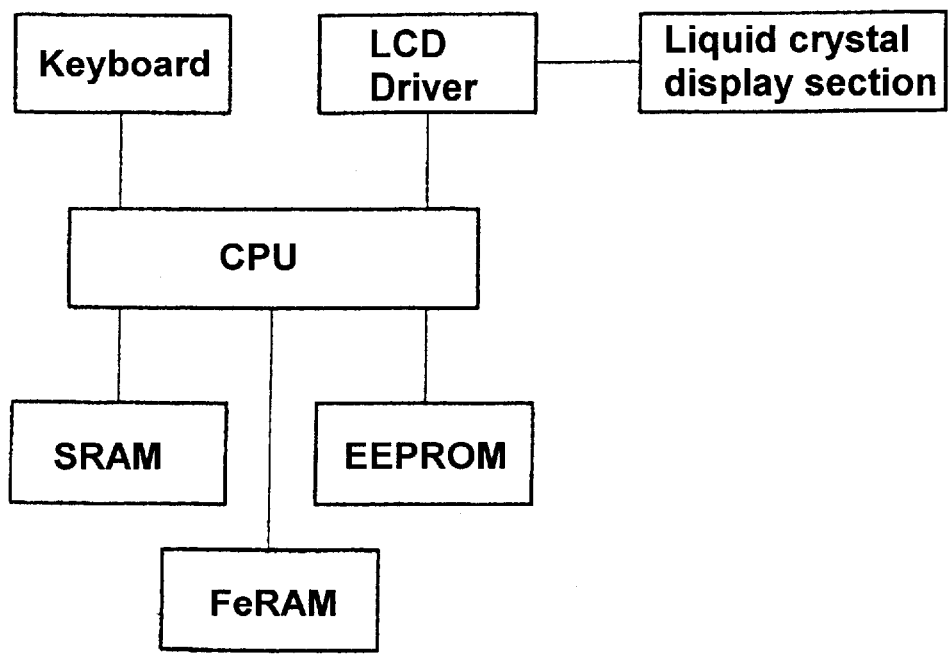
FIG. 4 shows a block diagram of a part of a hand-carry type telephone system as one example of an electronic apparatus in accordance with the present invention.

The semiconductor device thus formed can be applied to, for example, hand-carry type data terminals and telephones. FIG. 4 shows a part of an example of a system structure of an internal circuit thereof. As shown in FIG. 4, in addition to a FeRAM that is a semiconductor device in accordance with the present invention, an SRAM, an EEPROM, a keyboard and a LCD driver are connected through a bus line to a CPU. FIG. 5 shows a perspective view of a hand-carry type telephone that is equipped with the system. The hand-carry type telephone 600 shown in FIG. 5 is formed from a main body portion 610 and a lid portion 620. The main body portion 610 is equipped with well-known elements that perform linked actions, such as a keyboard 612, a liquid crystal display section 614, a receiver section 616, and antenna section 618. The lid portion 620 is equipped with a well-known transmission section 622 that performs actions linked with the main body section.

It is noted that in the embodiment described above, appropriate modifications and design changes that provide similar effects can be made within a range that does not depart from the subject matter of the present invention. For example, a so-called open bit line type semiconductor integrated circuit is described above as an example of the embodiment of the present invention. However, in addition to the above, the present invention is also applicable to a well-known, so-called "folded type" bit line type (Folded Type).

A reference potential to be applied to a sense amplifier can be applied at the same timing as a potential change on a bit line. Therefore, the timing to turn on the sense amplifier can be quickened, and thus the reading speed can be improved.

Also, a reference potential to be applied to a sense amplifier can be applied at the same timing as a potential change on a bit line. As a result, the sense amplifier securely operates against variations in the potential on the bit line associated with deviations in the cells, and therefore the operation margin is widened.

Furthermore, for supplying a reference potential to be used for data reading to a sense amplifier, reference potential application signals and signal lines for transmitting thereof, which are required in a conventional semiconductor integrated circuit, can be eliminated in the present invention. Accordingly, wiring patterns can be reduced, and a circuit system that generates and outputs reference potential application signals is made unnecessary, such that the circuit mounting area can be reduced and the reduction of required labor can be promoted.

What is claimed is:

1. A method for supplying a reference potential to a sense amplifier in a semiconductor integrated circuit equipped with a memory cell including a capacitor composing a ferroelectric body that stores data depending on a polarization state determined by an applied voltage and a direction of the voltage, the sense amplifier circuit that reads out data from the memory cell, and a reference potential generation circuit that generates a reference potential for the sense amplifier circuit, the method for supplying the reference potential to the sense amplifier in a semiconductor integrated circuit characterized in that, when the data is read from the ferroelectric body, the reference potential from the reference potential generation circuit is supplied to the sense amplifier circuit based on a signal that drives a cell plate that composes one electrode of the capacitor.

2. A semiconductor integrated circuit that reads the data from the ferroelectric body by the method for supplying a reference potential according to claim 1, the semiconductor integrated circuit characterized in comprising a memory cell including a capacitor composing a ferroelectric body that stores data depending on a polarization state determined by an applied voltage and a direction of the voltage, a sense amplifier circuit that reads out data from the memory cell, and a reference potential generation circuit that generates a reference potential for the sense amplifier circuit.

3. A semiconductor integrated circuit comprising a memory cell including a capacitor composing a ferroelectric body that stores data depending on a polarization state determined by an applied voltage and a direction of the voltage, a sense amplifier circuit that reads out data from the memory cell, and a reference potential generation circuit that generates a reference potential for the sense amplifier circuit, wherein a plate line is connected to a cell plate that composes one electrode of the capacitor for transmitting a drive signal for reading out the data, the semiconductor integrated circuit characterized in that a switch element is interposed in a supply path for supplying the reference potential between the reference potential generation circuit and the sense amplifier circuit, wherein the switch element is connected to the plate line, and is placed in an ON state upon receiving the drive signal that is transmitted to the plate line, and the reference potential is supplied to the sense amplifier circuit through the switch element.

4. The semiconductor integrated circuit according to claim 3, characterized in that the memory cell is equipped with a switch transistor that makes the capacitor store or discharge a charge, the switch element in the supply path for supplying the reference potential is a transistor, wherein the switch transistor in the supply path has a current supply capability that is the same as that of the switch transistor in the memory cell.

5. The semiconductor integrated circuit according to claim 4, characterized in that the switch transistor in the memory cell is an n-type transistor, the plate line is connected to the cell plate that is one of the electrodes of the capacitor, and one source/drain of the n-type transistor is connected to the other of the electrodes, a bit line is connected to the other of the source/drain of the n-type transistor, and the bit line is connected to the sense amplifier circuit, and the n-type transistor is a semiconductor integrated circuit that is driven on and off by a voltage applied through a memory cell selection word line that is connected to a gate thereof.

6. The semiconductor device characterized in comprising a memory cell group including many memory cells arranged side by side, the bit line and the plate line, the word lines, and the sense amplifier circuit in the semiconductor integrated circuit according to claim 5, wherein a data output line is connected to the sense amplifier circuit for reading out the data.

7. The semiconductor device according to claim 6 characterized in that the semiconductor device functions as a ferroelectric memory (FeRAM).

8. An electronic apparatus characterized in comprising the semiconductor device according to claim 7.

9. The semiconductor device characterized in comprising a memory cell group including many memory cells arranged side by side, the bit line and the plate line, the word lines, and the sense amplifier circuit in the semiconductor integrated circuit according to claim 2, wherein a data output line is connected to the sense amplifier circuit for reading out the data.

10. The semiconductor device according to claim 9 characterized in that the semiconductor device functions as a ferroelectric memory (FeRAM).

11. An electronic apparatus characterized in comprising the semiconductor device according to claim 10.

* * * * *

UNITED STATES PATENT AND TRADEMARK OFFICE
CERTIFICATE OF CORRECTION

PATENT NO. : 6,498,743 B2
DATED : December 24, 2002
INVENTOR(S) : Akira Maruyama It is certified that error appears in the above-identified patent and that said Letters Patent is hereby corrected as shown below:

Column 2,
Line 32, "AV" should be -- $\Delta V$ --.

Signed and Sealed this

Seventh Day of September, 2004

JON W. DUDAS
*Director of the United States Patent and Trademark Office*